United States Patent
Droz

[11] Patent Number: 5,895,235
[45] Date of Patent: Apr. 20, 1999

[54] PROCESS FOR MANUFACTURING TRANSPONDERS OF SMALL DIMENSIONS

[75] Inventor: Francois Droz, La Chaux-de-Fonds, Switzerland

[73] Assignee: EM Microelectronic-Marin SA, Marin, Switzerland

[21] Appl. No.: 08/930,571
[22] PCT Filed: Mar. 25, 1996
[86] PCT No.: PCT/CH96/00110
  § 371 Date: Oct. 7, 1997
  § 102(e) Date: Oct. 7, 1997
[87] PCT Pub. No.: WO96/32829
  PCT Pub. Date: Oct. 17, 1996

[30] Foreign Application Priority Data
  Apr. 12, 1995 [FR] France ................... 95 04392

[51] Int. Cl.⁶ .................. H01Q 1/40; H01L 23/31
[52] U.S. Cl. .................. 438/127; 438/110; 343/873; 428/36.9
[58] Field of Search ................. 340/870.17, 870.18, 340/825.54; 343/873; 438/110, 127; 342/51; 606/116, 117; 257/701; 119/215, 200; 128/899; 600/432; 29/605; 428/36.9

[56] References Cited
U.S. PATENT DOCUMENTS

| | | | |
|---|---|---|---|
| 4,042,955 | 8/1977 | Imai et al. | 357/72 |
| 4,594,644 | 6/1986 | Painter | 361/417 |
| 4,707,763 | 11/1987 | Kudo | 361/386 |
| 4,992,794 | 2/1991 | Brouwers | 342/51 |
| 5,025,550 | 6/1991 | Zirbes et al. | 29/605 |
| 5,235,326 | 8/1993 | Beigel et al. | 340/825.54 |
| 5,357,700 | 10/1994 | Schulte | 40/301 |
| 5,697,384 | 12/1997 | Miyawaki | 128/899 |

FOREIGN PATENT DOCUMENTS

| | | |
|---|---|---|
| 2 186 805 | 1/1974 | France . |
| WO 92/15105 | 9/1992 | WIPO . |
| WO 92/22827 | 12/1992 | WIPO . |

Primary Examiner—William Krynski
Assistant Examiner—Cathy F. Lam
Attorney, Agent, or Firm—Griffin, Butler Whisenhunt & Szipl

[57] ABSTRACT

A device, notably a transponder, comprising an electronic arrangement and a coating formed by an envelope defining a pocket and by a solidified binding in which is embedded the electronic arrangement. The envelope presents an opening having served for the introduction of the electronic arrangement and the binding during the manufacture of the device. The external surface of the device in the region of the opening is formed by the solidified binding. For the manufacture of the device such has described hereabove, it is envisaged to use a reservoir acting to fill the pocket by the binding and to recover a surplus of provided binding, this surplus of binding and the reservoir being separated from the device after the binding has at least partially solidified.

9 Claims, 3 Drawing Sheets 5,895,235

PROCESS FOR MANUFACTURING TRANSPONDERS OF SMALL DIMENSIONS

The present invention concerns a transponder of small dimensions. A transponder is an electronic module functioning as emitter-receiver. In general, a responder is adapted to supply an identification signal in response to a received excitation signal, which supplies the energy necessary to enable the transponder to generate the identification signal.

Several transponders of small dimensions are known in the prior art. In the document U.S. Pat. No. 5,025,550, the transponder described is formed by a coil electrically connected to an electronic circuit, this arrangement being located in the interior of a glass case entirely enveloping the electronic arrangement.

In the document U.S. Pat. No. 5,235,326, a transponder is described which is also formed by an electronic arrangement comprising an integrated circuit connected to a coil, this arrangement being located in the interior of a closed casing entirely enveloping the electronic arrangement. To assure the stability of the electronic arrangement, a binding is provided in the interior of this casing.

A similar device is also described in the patent U.S. Pat. No. 4,992,794, where the casing is closed by a plug. Such a solution is also proposed in International Patent Application WO 92/15105. This latter document further proposes other embodiments for coating the electronic arrangement of the transponder. A simple over-moulding of the electronic arrangement or the placement the electronic arrangement between two sheets of thermofusible plastic is envisaged.

Finally, a transponder of the same type is described in International Patent Application WO 92/22827. Various embodiments of the transponder are proposed in this document. According to one particular embodiment (FIG. 4 4 of this document), the introduction of the electronic arrangement, formed by the coil electrically connected to an electronic circuit, into the interior of a tube comprising in its upper part and in the interior of this tube a ring of fusible material, is envisaged. This ring is melted so as to close the entrance opening of the electronic arrangement to form the transponder.

All the transponders previously described present a major inconvenience given that the coating of the envisaged electronic arrangement requires a relatively complex fabrication process which increases the cost of the transponder.

Furthermore, in all the transponders described in the various documents cited hereabove, it is very difficult to ensure a total filling of the external envelope defining a closed casing integrally surrounding the envisaged electronic arrangement in the interior of this casing.

The present invention proposes to alleviate the inconveniences of the prior art transponders described hereabove. To that effect, an aim of the invention is to provide an inexpensive transponder, in which the protection of the electronic arrangement is completely assured.

Another aim of the present invention is to provide a process for manufacturing electronic devices, notably transponders, which enables their manufacture in an industrially manner for a low production cost.

A object of the invention is thus a transponder comprising an electronic arrangement and a coating protecting this electronic arrangement. The device is characterized in that the coating is formed by an external envelope, defining a pocket and presenting an opening, and a solidified binder completely filling the envelope and forming an exterior surface of the device in the region defined by said opening, the electronic arrangement being embedded in the binding.

Due to the particular features of the device according to the invention, the electronic arrangement is properly protected by an open envelope, that is to say, presenting an opening by which the electronic arrangement and the binding have been introduced, and by the filling binding in which the electronic arrangement is embedded. Such a transponder is distinguished from the above-described prior art in that the external envelope is not entirely closed, which avoids at least one operation during the process of manufacturing the device. In addition, given that the binding itself forms an exterior surface of the transponder, it is easy to ensure a complete filling of the envelope, which makes the transponder compact and resistant. Next, the electronic arrangement is completely covered by the binding, which assures stable positioning and total protection.

Another object of the invention is a process for manufacturing an electronic device, characterized in that it comprises the following steps:

providing an envelope, defining a pocket, having an upper opening, providing a reservoir located above said envelope, this reservoir communicating with the pocket by the upper opening and having at least one filling opening, providing a binding in liquid form in the reservoir, providing an electronic arrangement in the pocket by the upper opening provided in the envelope, hardening of the provided binding, separation of the electronic device, formed by the envelope and the electronic arrangement embedded in the solidified binding, from the reservoir.

The process according to the above described invention presents several advantages. Notably, the presence of the reservoir enables the provision of quantitatively more binding than is necessary to form the electronic device according to the invention. The delicate question of the binding dose is therefore diminuated, whilst assuring a complete filling electronic device according to the invention. The delicate question of the binding dose is therefore diminuated, whilst assuring a complete filling of the pocket defined by the envelope by the electronic device.

In the case where the upper opening of the envelope is relatively small, the reservoir can play the role of a funnel thus enabling the easy filling of the pocket. This filling may require complex and a costly equipment without the presence of the said reservoir. According to a particular embodiment of the invention, the reservoir is made from the same material as and integral with the envelope. From this fact, the initially provided reservoir and the envelope form a single piece of the same material. In such a case, the final separation of the electronic device from the reservoir can be perform by machining, for example, by simple sectioning, with the aid of a blade or a laser beam, at the level of the upper opening of the electronic device.

According to a preferred realisation, several envelopes may be associated with a common reservoir, each of these envelopes presenting an upper opening into the common reservoir. From this fact, it is possible to ensure the filling of several envelopes by a single supply of binding from the common reservoir. This step can be advantageously realised by the deposition of a line of binding closing the openings of several envelopes.

Other characteristics and advantages of the invention will be better described with the aid of the following description, made in reference to the annexed drawings in which.

Figure 1:
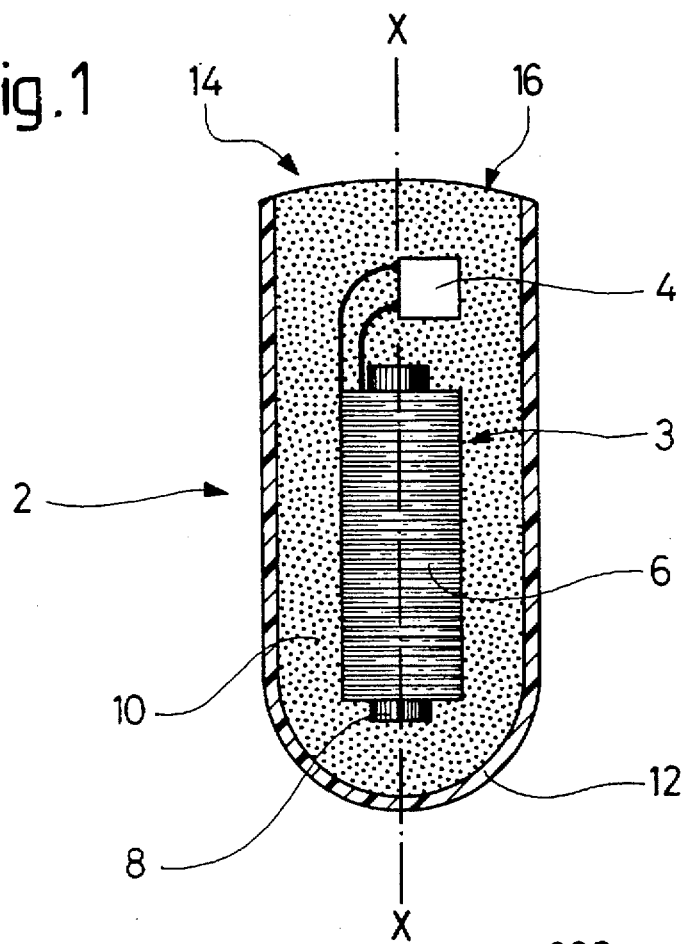
FIG. 1 represents schematically a longitudinal cross section of a first embodiment of a transponder according to the transponder.

A first embodiment of a transponder according to the invention is represented in FIG. 1. In this FIG. 1, the transponder 2 is represented according to a longitudinal cross section. It comprises an electronic arrangement 3 formed by an integrated circuit 4 electrically connected to a coil 6 wound around a coil 8. The electronic arrangement 3 is incorporated in a coating formed by a binding 10 in which it is embedded and by an envelope 12 which defines an exterior wall of the transponder 2.

According to the invention, the envelope 12 does not totally envelope the electronic arrangement 3. In fact, the envelope 12 presents an opening 14 by which the electronic arrangement 3 and the binding 10 have been introduced into this envelope. The envelope 12 thus defines an opening pocket, entirely filled by the binding 10 and the electronic arrangement 3. It will be noted that, according to the invention, an exterior surface 16 of the transponder 2 is formed by the binding 10 itself. The envelope 12 possesses an axis of revolution X—X and the exterior surface 16 may be planar, rounded or slightly hollow.

During the manufacture of the transponder 2, one will be watchful that the electronic arrangement 3 is entirely covered by the binding 10 in the region of the opening 14. If, after the filling of the envelope 12 by the binding 10 and after hardening of this binding, the part of the envelope situated in the region of the opening 14 is not entirely and correctly filled by the binding 10, or if the surface 16 formed by the binding presents bumps and irregularities forming significant projections, it is possible to ressort to an apparatus acting to smooth the external surfaces of such objects, this being known to a skilled person. In the language of the profession, one refers to the smoothing of the rotating barrel.

With the aid of FIGS. 2 to 5, there will be described hereafter a particularly advantageous mode of realisation of a process for manufacturing electronic devices according to the invention.

In the above-mentioned mode of realisation, at least one envelope 20, defining a pocket, with an upper opening 26, and a reservoir 28 disposed above the envelope 20, are provided. The reservoir 28 comprises a lower hole corresponding to the upper opening 26 of the envelope 20. Next, the reservoir 28 is opened in its upper part to enable binding to be brought from this reservoir. It will be noted that, particularly advantageously, the reservoir 28 is associated with several envelopes 20, 20A, 20B and 20C each presenting an upper opening 26, 26A, 26B and 26C by which the pockets defined by these envelopes communicate with the common reservoir 28. Only four envelopes have been shown in FIG. 2, but this is in no manner limitative. In fact, it is possible to foresee a reservoir associated with any number of envelopes. As an example, the diameter of the opening 26 is between two and three millimeters, while the principal dimensions of the surface defined by the edge 30 of the upper opening of the reservoir 28 are greater, the width being approximately 5 to 6 mm and the length being able to attain several centimeters according to the number of intended envelopes.

When the principal dimensions of the opening 26 are relatively small, notably less than 5 mm, the reservoir 28 also fulfils the role of supply for the provided binding. In fact, the binding provided in the reservoir 28, during a step of the process described herein, is formed by a viscous liquid. Given the viscosity of the binding provided, the drops deposited or the mass of the binding deposited in the reservoir 28 present dimensions greater than the dimensions of the upper openings of the envelopes, notably of the average principal dimensions of these openings. When the openings 26, 26A, 26B and 26C have small dimensions, the binding, provided in the form of a viscous liquid in the region defined by each of these openings, penetrates into the pockets defined by the envelopes 20, 20A, 20B and 20C. The reservoir 28 has effectively a function of reservoir of the binding during the time interval necessary for the filing of said pockets.

Further to what has been mentioned hereabove, it will thus be noted that the reservoir 28 fulfils, firstly, the role of a reservoir for the binding provided in form of a viscous liquid and, secondly, the role of the supply for the filling of the pockets defined by the envelopes provided with the reservoir 28. These two functions are particularly necessary and advantageous for the manufacture of electronic devices, notably for transponders of small dimensions.

It will be noted that the envelopes 20, 20A, 20B and 20C of made of the same material as the reservoir 28. The reservoir 28 and the envelopes 20, 20A, 20B and 20C thus formed by a single piece of same material. However, in another embodiment, it is possible to envisage that the reservoir 28 is materially separated from the provided envelopes.

Figure 3:
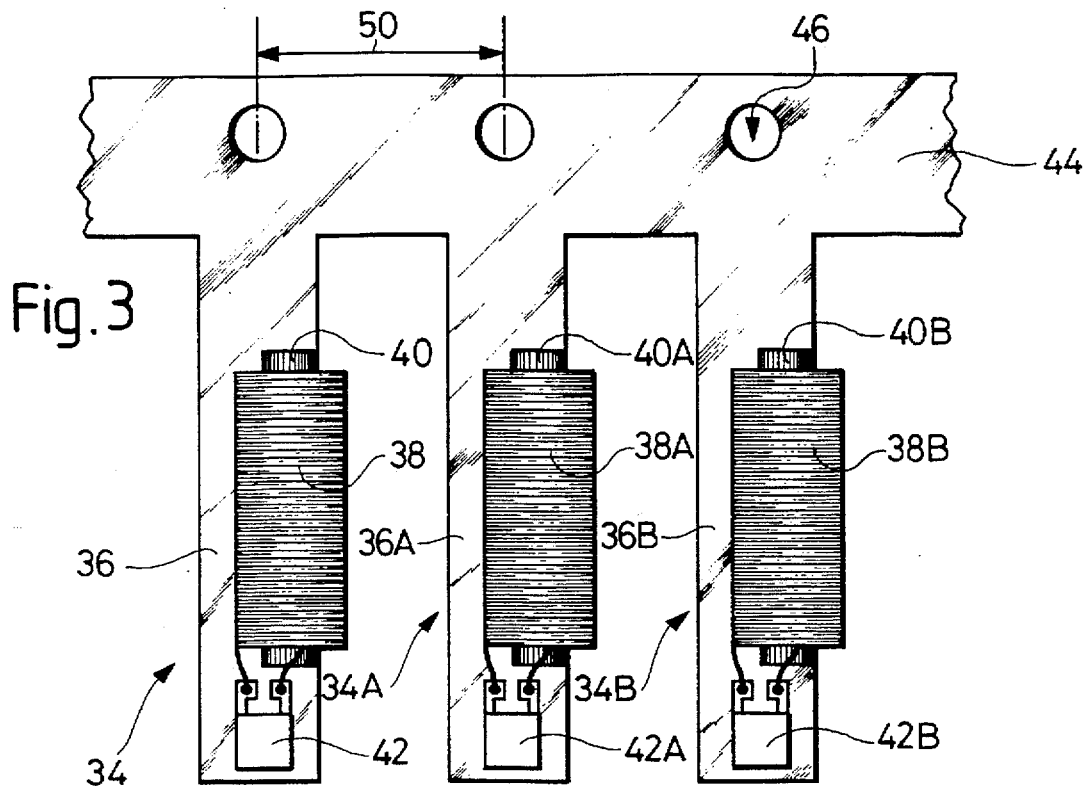
FIG. 3 represents several electronic arrangements connected to a common support for the said realisation of the process according to the invention.

Several electronic arrangements 34, 34A and 34B are represented in FIG. 3, each formed by a substrate 36, 36A and 36B on which is arranged a coil 38, 38A and 38B wound around a core 40, 40A, 40B. Each coil is electrically connected to an integrated circuit 42, 42A and 42B. As an example, each electronic arrangement 34, 34A and 34B defines an electronic device for the identification of persons or objects.

Figure 4:
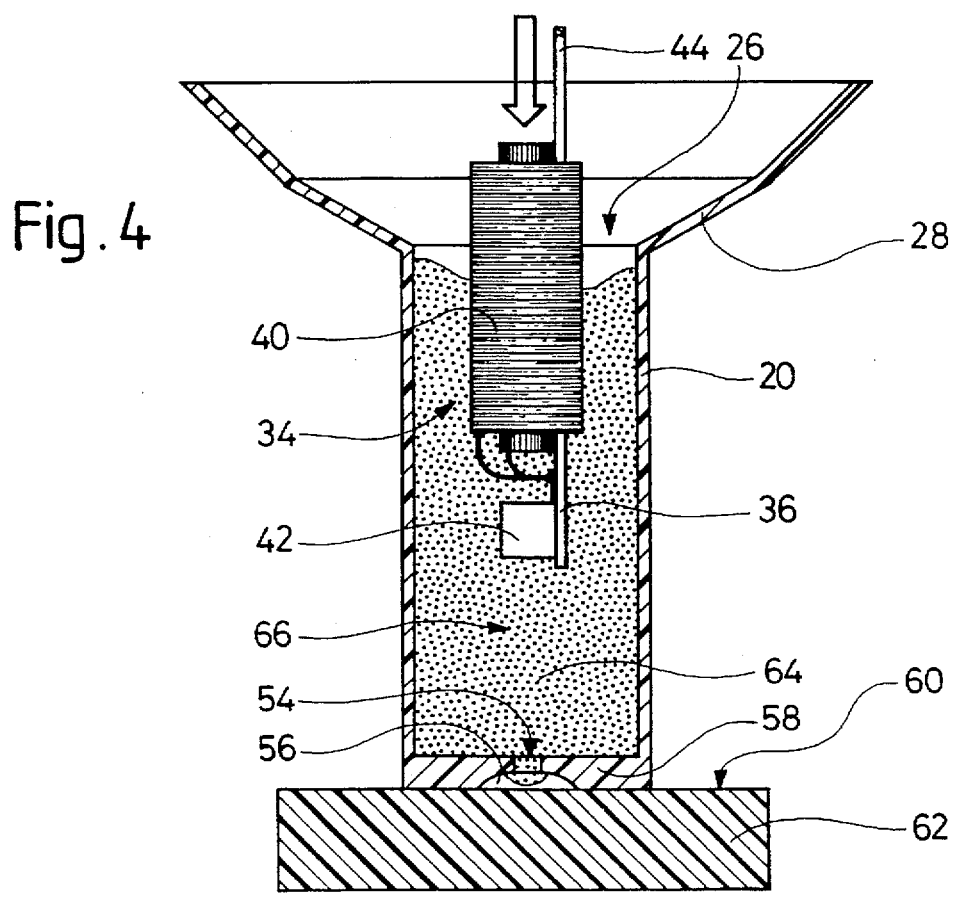
FIGS. 4 and 5 represent schematically, according to one cross-sectional representation, two successive states during the said realisation of the process according to the invention (the electronic arrangement has not been sectioned)

The substrates 36, 36A and 36B are all connected to a common support 44, which presents positioning holes 46. The electronic arrangements 34, 34A and 34B are placed regularly along the support 44, the distance 50 between two electronic arrangements being equal to the distance 48 separating two neighbouring envelopes. Thus, according to the invention, it is envisaged to provide several electronic arrangements connected to a common support, the number of these electronic arrangements corresponding to the number of provided envelopes. From this fact, it is clearly possible to simultaneously introduce the plurality of electronic arrangements in the plurality of corresponding envelopes. Thus, once the binding is provided in the reservoir 28, the electronic arrangements are simultaneously introduced in the pocket defined by the envelopes at least partially filled with binding, as is represented in FIG. 4. In this FIG. 4, the envelope 20 and the reservoir 28 are represented in cross-section, the envelope 20 being longitudinal sectioned whilst the reservoir 28 is transversally sectioned.

Figure 5:
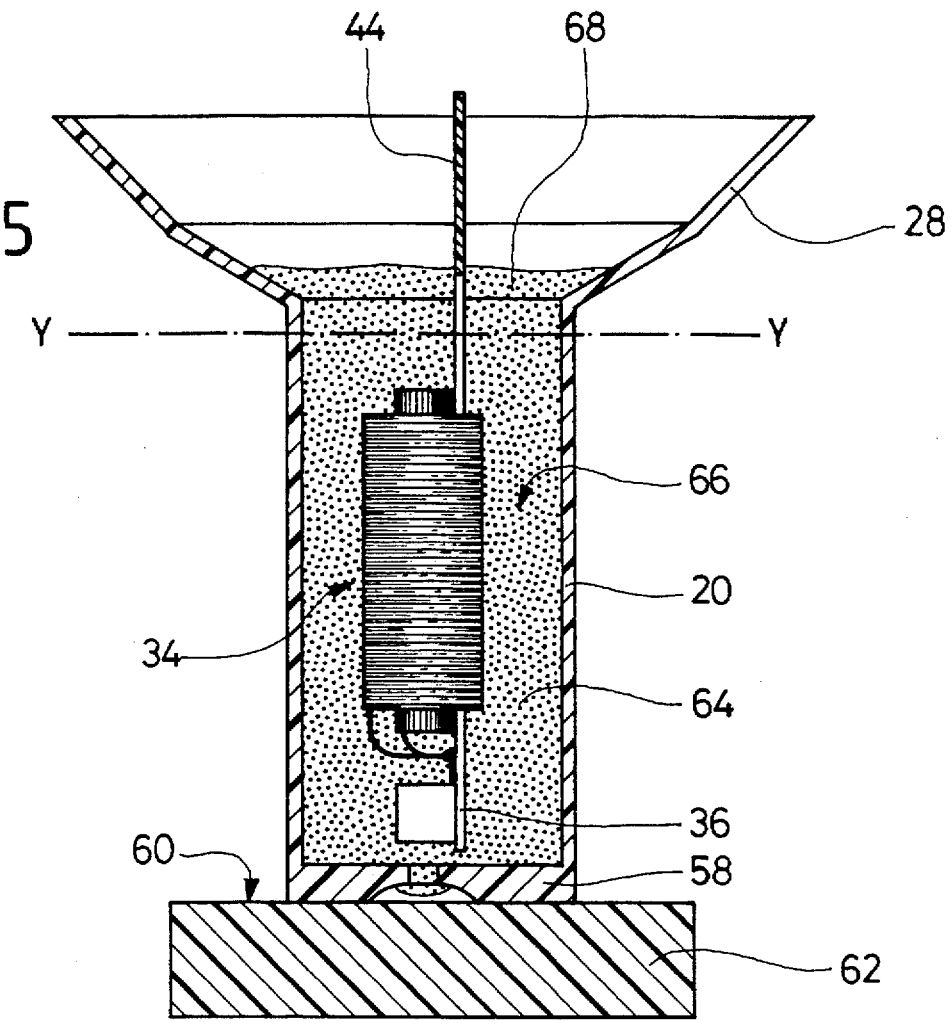

In the following, reference will be made to FIGS. 4 and 5 for the description of the mode of realisation of the process according to the invention herein described.

A hole 54 is provided in the lower region of the envelope 20. In addition, the hole 54 opens into an external recess 56 formed in the bottom 58 of the envelope 20. The hole 54 has a function of an orifice for the escape of air during the introduction of the binding of the envelope 20. The recess 56 is provided to recuperate the binding able to leak through the hole 54 during the filling of the envelope 20. However, in order to limitate the quantity of binding which is able to escape from the hole 54, an advantageous variant of the mode of realisation herein described envisages to support the bottom 58 against a work surface 60 during introduction of the electronic arrangement 34, as it is represented in FIG. 4. As an example, the surface 60 forms the upper surface of a block 62 of silicon. Thus, the binding 64 entirely fills the envelope 20 during the introduction of the electronic arrangement 34, as is represented in FIG. 5.

Once the electronic arrangement 34 is completely introduced into the pocket 56 defined by the envelope 20, the surplus of binding is collected by the reservoir 28. The reservoir 28 has thus a third function, that is to say that, of recovering a surplus of binding, which enables the assurance of the complete filling of the pocket 66 by the binding 64 without requiring a very precise dose during the provision of the binding.

Next, the binding 64 solidifies to form a compact mass in which is embedded the electronic arrangement 34. It will be noted that during the phase of solidification of the binding 64, it is possible to maintain the bottom 58 of the envelope 28 against the surface 60 of the bloc 62 or to withdraw the block 62 given that there is no longer an over-pressure exerted on the binding 64, as is the case during the introduction of the electronic arrangement 34 in the pocket 66. It will be noted that the effect of over-pressure created by introduction of the electronic arrangement 34 in the pocket 66 is particularly present when the dimensions of the section of the coil introduced substantially correspond to the dimensions of the upper opening 26 of the envelope 20.

Once the electronic arrangement 34 is introduced into the pocket 66 and the binding 64 is at least partially solidified, it is envisaged to separate the envelope 20, acting to form the electronic device, from the reservoir 28. To do this, there is envisaged, in the present mode of realisation, a sectioning at the level of the line Y—Y. This sectioning can be realised by several techniques and, for example, with the aid of a blade or a source of heat, such as a laser beam. During the sectioning, the substrate 36 of the electronic arrangement 34 is separated from the support 44, which remains with the reservoir 28 and the residual binding 68.

Figure 6:
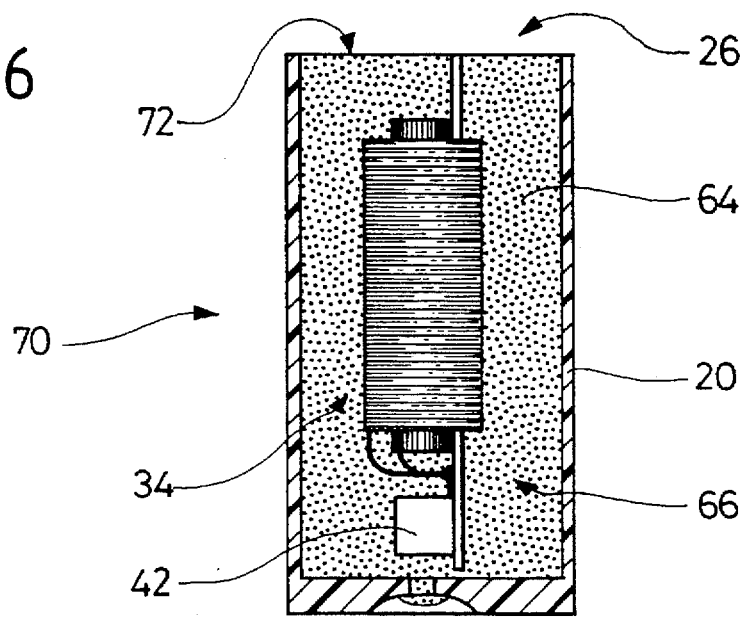
FIG. 6 represents a second embodiment of a transponder obtained by the process of manufacturing described with the aid of FIGS. 2 to 5.

An electronic device, notably a transponder 70, such as is represented in cross-section in FIG. 6 is therefore obtained. The transponder 70, defining a second embodiment of the device according to the invention, presents an envelope 20 defining an external wall of this transponder 70. Next, the envelope 20 forms an open pocket 66, this envelope 20 presenting an opening 26. The surface 72 of the transponder 70 in the region of the opening 26 is formed by the solidified binding 26 in which is embedded the electronic arrangement 34.

Figure 2:
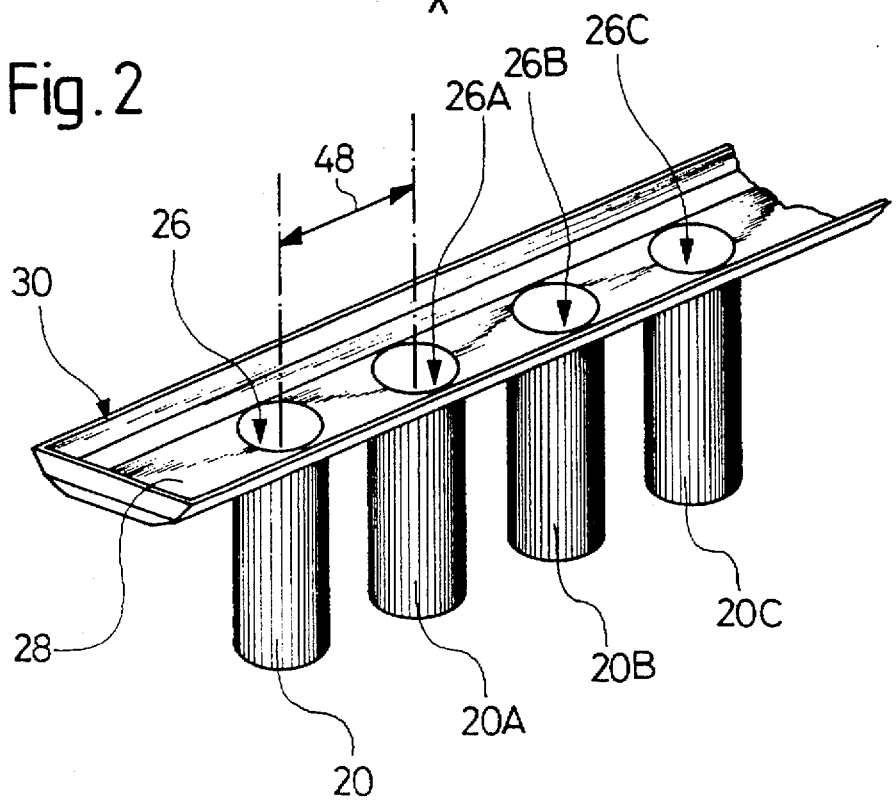
FIG. 2 represents an arrangement of envelopes associated with a common reservoir for a realisation for the process of fabricating transponders according to the invention.

It will be noted that the section of the transponder 70 may have any geometric form, the circular form presented in FIG. 2 being in no manner limitative.

It will also be noted that the envelope 20 is, for example, made from plastic material and that the binding 64 is formed notably by a two-component glue, for example an epoxy resin, an acrylic resin or again a polyurethane resin. In the case of an epoxy resin, the process of manufacture described hereabove is substantially realised at ambient temperature. One therefore obtains an electronic device which is compact and complete without requiring a hot coating technic which can be troublesome for the printed circuit 42.

The envisaged reservoir in the process for manufacturing an electronic device according to the invention may have several different structures. It may be notably possible to envisage that the reservoir is formed by several cavities defining respective funnels for the envelopes associated with this reservoir.

According to a variant of the mode of realisation of the process described hereabove, the reservoir is closed after the introduction of the electronic arrangements such that an over pressure can be created in the volume defined by the envelopes and reservoir.

It will be noted that the binding may, according to two variants, be provided before the closing of the reservoir, or after this closing, by a filling opening enabling to provide the binding under pressure. In this latter case, it is notably possible to envisage a complete filling of the reservoir whose dimensions are reduced to limit the quantity of residual binding.

It will also be noted that the binding may generally be provided before or after the electronic arrangements.

According to another mode of realisation of the process according to the invention, it is envisaged to unmould the solidified binding in the envelopes and the reservoir, notably with the aid of the support 44 in a variant using elements similar to those represented in FIGS. 2 and 3, and then to separate the binding individually incorporating the electronic arrangement from the solidified residual binding in a reservoir. In this case, the obtained device has no external envelope.

It will finally be noted that the process according to the invention is perfectly suited to the high volume production of electronic devices in which the electronic arrangement are completely protected. However, the process according to the invention may also be used for the piece-by-piece production of an electronic device. In this case, a reservoir may be provided for each envelope.

I claim:

1. Process of manufacturing a transponder characterized in that it comprises the following steps:

providing an envelope defining a pocket having an upper opening;

providing a reservoir disposed above said envelope, this reservoir communicating with said pocket by said upper opening and having at least one filling opening;

providing a binding material in liquid form in said reservoir;

providing an electronic arrangement in said pocket by said upper opening;

hardening of said binding material which entirely fills said envelope; and separation of said transponder, formed by said envelope and said electronic arrangement embedded in said solidified binding material, from said reservoir.

2. Process according to claim 1, characterized in that the quantity of said binding material provided is greater than a quantity of this binding material incorporated in said transponder resulting after said separation step, this separation being effectuated by a sectioning at the level of said upper opening of said envelope.

3. Process according to claim 2, characterized in that said reservoir is made from the same material as and integral with said envelope, said initially provided reservoir and said envelope forming a single piece of a same material.

4. Process according to claim 1, characterized in that said provided envelope presents a hole in its lower part.

5. Process according to claim 4, characterized in that said hole opens into an external recess provided in said envelope.

6. Process according to claim 4, characterized in that said hole is closed on the external side of said envelope by sealing means during the provision of said electronic arrangement in said pocket formed by said envelope.

7. Process according to claim 1, characterized in that said reservoir acts as funnel for the filling of said pocket by said binding material, a contour of the filling opening of said reservoir defining a surface whose two principal dimensions are greater than at least the smallest dimensions of the upper opening of said envelope.

8. Process according to claim 1, by which it is envisaged to simultaneously manufacture several transponders, characterized in that several envelopes are provided with a single common reservoir communicating with the pockets, defined by said envelopes, by the upper openings of these envelopes, several electronic arrangements being provided and introduced respectively in said pockets.

9. Process according to claim 8, characterized in that said electronic arrangements are initially connected to each other by a support, these electronic arrangements being located under said support with a regular spacing corresponding to the spacing of said provided envelopes, said electronic arrangements being simultaneously introduced into said pockets with the aid of said support, this support being separated from these electronic arrangements during said separation step in which the transponders, respectively formed by said envelope and said electronic arrangements embedded in said binding material filling these envelopes are separated from said common reservoir.

* * * * *